United States Patent
Jung

(10) Patent No.: US 7,082,179 B2
(45) Date of Patent: Jul. 25, 2006

(54) CLOCK DIVIDER OF DELAY LOCKED LOOP

(75) Inventor: Hea-Suk Jung, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 21 days.

(21) Appl. No.: 10/735,336

(22) Filed: Dec. 12, 2003

(65) Prior Publication Data

US 2005/0017777 A1    Jan. 27, 2005

(30) Foreign Application Priority Data

Jul. 25, 2003    (KR)    ............... 10-2003-0051428

(51) Int. Cl.
*H03K 21/00*    (2006.01)

(52) U.S. Cl. ............................. 377/47; 327/115

(58) Field of Classification Search ............. 377/47; 327/115, 118, 175, 294, 298; 326/97, 98
See application file for complete search history.

(56) References Cited

U.S. PATENT DOCUMENTS 6,651,181 B1 *  11/2003  Lacey ..................... 713/503
6,815,985 B1 *  11/2004  Jeon ....................... 327/115
6,877,123 B1 *   4/2005  Johnston et al. ........ 714/731

FOREIGN PATENT DOCUMENTS

KR        1998-68005       10/1998

* cited by examiner

*Primary Examiner*—Kenneth B. Wells
*Assistant Examiner*—Cassandra Cox

(57) ABSTRACT

A divider of a DLL(delay locked loop) measures tAC for various periods due to variation of process, temperature and a supply voltage and provides a divided clock having an optimum tAC. The clock divider includes a clock dividing unit, a test mode clock providing unit and a normal mode clock providing unit. The clock dividing unit receives a source clock of the DLL to generate a plurality of divided clocks, each having a period different from each other. The test mode clock providing unit selectively outputs the plurality of the divided clocks in a test mode in response to a test mode signal and a test mode period selecting signal. And, the normal mode clock providing unit outputs selected one of the plurality of the divided clocks in a normal mode in response to the test mode signal.

8 Claims, 6 Drawing Sheets

US 7,082,179 B2

CLOCK DIVIDER OF DELAY LOCKED LOOP

FIELD OF THE INVENTION

The present invention relates to a semiconductor circuit technique; more particularly, to a delay locked loop; and, even more particularly, to a clock divider of a delay locked loop.

BACKGROUND OF THE INVENTION

Typically, in a system or a circuit, a clock is used as a reference to match operation timing, or used to guarantee faster operation without error. When an external inputted clock is used inside the system or the circuit, time delay(or, clock skew) happens due to the internal circuit. Therefore, a DLL(Delay Locked Loop) is introduced to compensate such a time delay so that an internal clock can have same phase as the external clock.

The delay time between output data and the external clock is called as tAC. That is, it means time difference between the expected clock timing for data output and the actual clock timing for data output.

On the other hand, because the DLL is less affected by noise compared to a PLL(Phase Locked Loop), it is widely used for a synchronous semiconductor memory such as a DDR SDRAM(Double Data Rate Synchronous DRAM). Among some kinds of the DLL, a register controlled DLL is a most typically used DLL is.

FIG. 1 provides a block diagram of a register controlled DLL of a DDR SDRAM in prior art(see, Korean Patent publication No. 10-2993-0002130).

Referring to FIG. 1, the register controlled DLL comprises a first clock buffer 11, a second clock buffer 12, a clock divider 13, a first delay line 14, a second delay line 15, a third delay line 16, a shift register 17, a first DLL driver 20, a second DLL driver 21, a delay model 22, a phase comparator 19 and a shift controller 18. The first clock buffer 11 receives an inverted external clock/clk as its input to generate an internal clock fall_clk that is synchronized to the falling edge of the external clock clk. The second clock buffer 12 receives the external cock clk as its input to generate an internal clock rise_clk that is synchronized to the rising edge of the external clock clk. The clock divider 13 divides the internal clock rise_clk that is synchronized to the rising edge of the external clock clk by 1/n(here, n is a positive integer, typically 8) to output a delay monitoring clock dly_in and a reference clock ref. The first delay line 14 receives the internal clock fall_clk that is synchronized to the falling edge of the external clock clk. The second delay line 15 receives the internal clock rise_clk that is synchronized to the rising edge of the external clock clk. The third delay line 15 receives the delay monitoring clock dly_clk. The shift register 17 determines delay amounts for the first, the second and the third delay lines 14, 15, 16. The first DLL driver 20 drives the output ifclk of the first delay line 14 to generate a DLL clock fclk_dll. The second DLL driver drives the output irclk of the second delay line 15 to generate a DLL clock rclk_dll. The delay model 22 receives the output of the third delay line 16 to make the clock go through delay condition as same as the actual clock path. The phase comparator 19 compares the pahse of the output fbclk to that of the reference clock ref. The shift controller 18 controls shift direction of the shift register 17 in response to the control signal ctrl from the phase comparator 19.

First, the first clock buffer 11 generates the internal clock fall_clk that is synchronized to the falling edge of the external clock clk and the second clock buffer 12 generates the internal clkc rise_clk that is synchronized to the rising edge of the external clock clk. The clock divider 13 performs 1/n division on the internal clock rise_clk that is synchronized to the rising edge of the external clock clk to generate the clocks ref, dly_in that are synchronized to every n-th clock of the external clock clk. Because both of the reference clock ref and the delay monitoring clock dly_in are divided signals from the internal clock rise_clk that is synchronized to the rising edge of the external clock clk, they have pulse widths of one period tCK of the external clock clk. Also, the phase of the reference clock ref is different from that of the delay monitoring clock dly_in by 180 degrees.

During initial operation, the delay monitoring clock dly_in is outputted through only one unit delay device of the third delay line 16 of the delay monitor 10 and then passes through the delay model 22 to be outputted as a feedback clock fbclk. Here, the feedback clock fbclk is delayed by the delay time of the delay model 22 compared to the output clock of the third delay line 16.

On the other hand, the phase comparator 19 generates the control signal ctrl by comparing the rising edge of the reference clock ref to the rising edge of the feedback clock fbclk. The shift register 18 outputs a shift control signal SR, SL to control the shift direction of the shift register 17 in response to the control signal ctrl. The shift register 17 determines the delay amounts of the first, the second and the third delay lines 14, 15, 16 in response to the shift control signal SR, SL. That is, when the SR(Shift Right) signal is inputted, the register is shifted to the right. When the SL(shift Left) signal is inputted the register is shifted to the left. After that, while comparing the delay controlled feedback clock to the reference clock, it occurs delay locking at that moment when the two clocks have minimum jitter, in which the DLL clocks fclk_dll, rclk_dll have their phases as same as the external clock clk that is outputted from the first and the second DLL drivers 20, 21, respectively.

The conventional delay locked loop as described above does not use the internal clock rise_clk that is synchronized to the rising edge of the external clock clk but use the divided clock that is divided by the clock divider 13, as its input clock. The reason why it does so is benefit of reducing current that is spent to compare phases from reducing the number of comparisons of the phase comparator 19(as the clock is divided). Also, as the frequency of the external clock is raised due to increasing speed of the semiconductor memory, the divided clock is used because a more complicated control logic should be added to the shift comparator 19 to monitor the delay by using such a high frequency.

FIG. 2 is a circuit diagram of a ⅛ clock divider in prior art.

Referring to FIG. 2, the conventional ⅛ divider includes a first dividing stage 200, a second dividing stage 201, and a third dividing stage 202. The first dividing stage 200 receives the internal clock rise_clk that is synchronized to the rising edge of the input clock clk to generate a ½ divided clock A. The second dividing stage 201 receives the output clock of the first dividing stage 200 to generate a ¼ divided clock B. The third dividing stage 202 receives the output clock of the second dividing stage 201 to generate a ⅛ divided clock ref.

Here, each of the dividing stages 200, 201, 202 is constituted by a T-flip flop using a cross-coupled NAND latch. The ⅛ divided clock from the third dividing stage 202 is used as the reference clock ref and its inverted version is use as the monitoring clock dly_in.

FIG. 3 shows a waveform diagram for explaining operation of the circuit shown in FIG. 2.

Referring to FIG. 3, the first dividing stage 200 receives the output clock rise_clk having a clock period of tCK of the second clock buffer 12 as its input to generate the clock signal A having a clock period of 2 tCK. The second dividing stage 201 receives the output clock A of the first dividing stage 200 as its input to generate the ½ divided clock signal B. The clock signal B has a period of 4 tCK compared to the input clock rise_clk of the divider, which goes to a low level per 4 periods and stays for tCK. The third dividing stage 202 receives the output clock B of the second dividing stage 201 as its input to generate the ½ divided clock signal ref. The clock signal ref has a period of 8 tCK compared to the input clock rise_clk of the divider, which goes to a low level per 8 periods and stays for tCK.

On the other hand, when the clock period that is divided by the clock divider is fixed as described above, the tAC due to variation of process, temperature, voltage and etc. of the memory cannot be measured. The reference clock ref and the monitoring clock dly_in to optimize the tAC cannot be provided, either.

The problem mentioned above may happen all kinds of the delay locked loops that use the divider as well as the register controlled delay locked loop.

SUMMARY OF THE INVENTION

It is, therefore, a primary object of the present invention to provide a clock divider of a delay locked loop, capable of measuring tAC for various periods due to variation of process, temperature and a supply voltage and providing a divided clock having an optimum tAC.

In accordance with the present invention, there is provided a clock divider of a DLL(delay locked loop), which includes a clock dividing unit for receiving a source clock of the DLL to generate a plurality of divided clocks, each having a period different from each other; a test mode clock providing unit for selectively outputting the plurality of the divided clocks in a test mode in response to a test mode signal and a test mode period selecting signal; and a normal mode clock providing unit for outputting selected one of the plurality of the divided clocks in a normal mode in response to the test mode signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In the present invention, a divider of a DLL(Delay Locked Loop) comprises a clock providing unit, a test mode clock providing unit and the normal mode clock providing unit so that it can measure tAC for various periods due to variation of process, temperature and a supply voltage and provides a divided clock having an optimum tAC.

Hereinafter, with reference to the accompanying drawings, a preferred embodiment of the present invention will be explained in detail.

Figure 1:
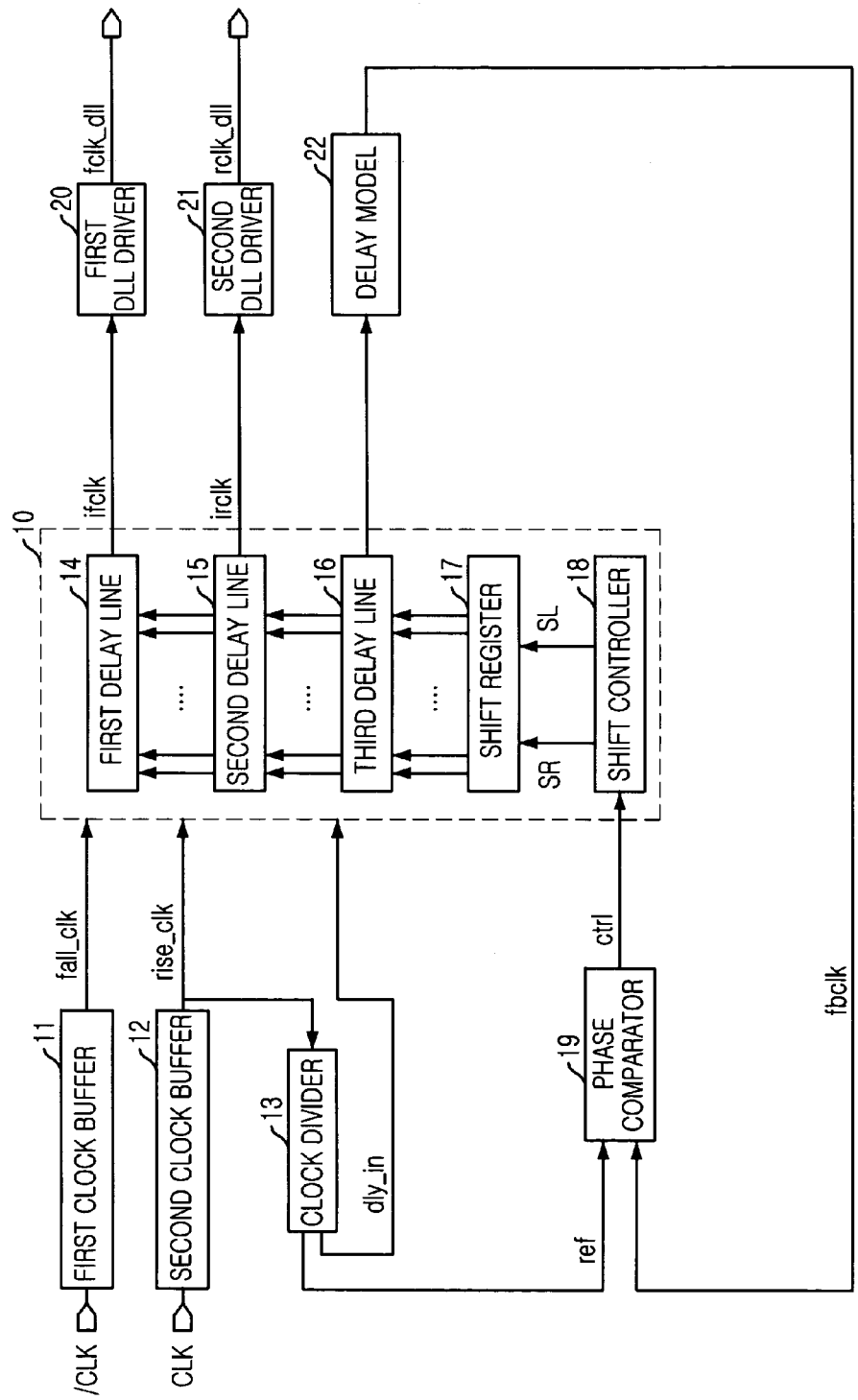
FIG. 1 provides a circuit diagram of a delay locked loop in prior art.
Figure 2:
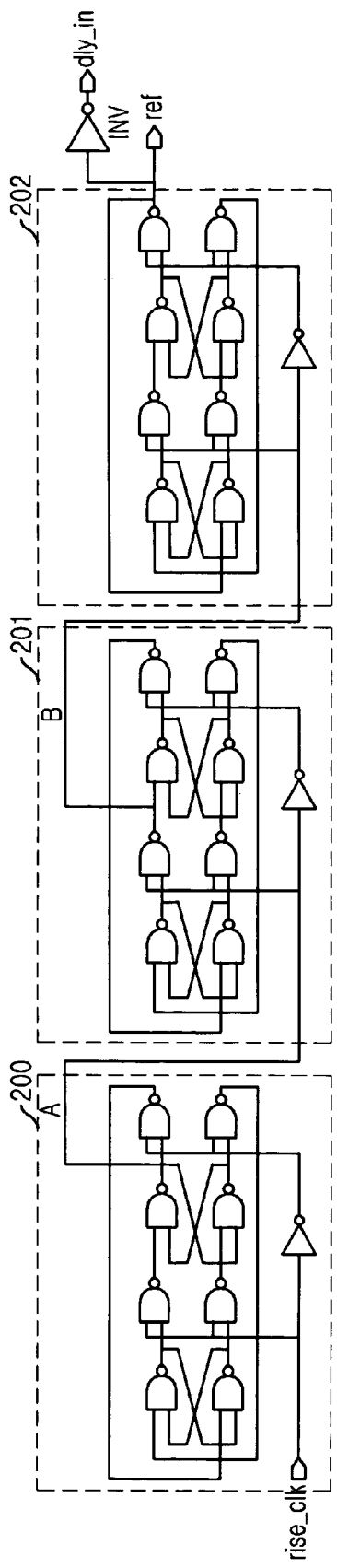
FIG. 2 is a circuit diagram of a ⅛ clock divider in prior art.
Figure 3:
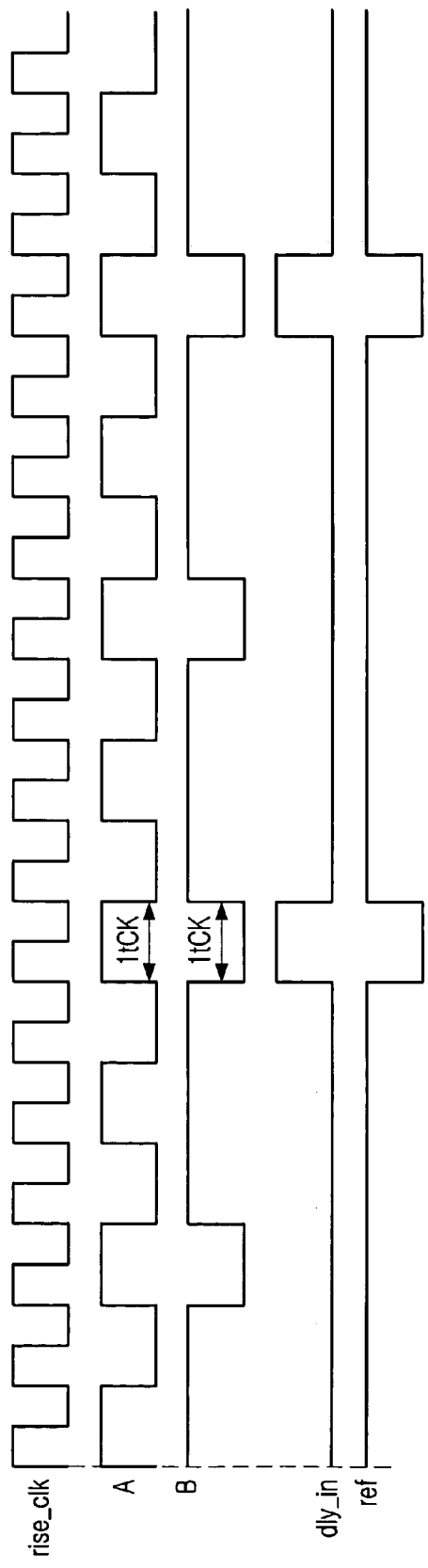
FIG. 3 shows a waveform diagram for explaining operation of the circuit shown in FIG. 2.
Figure 4:
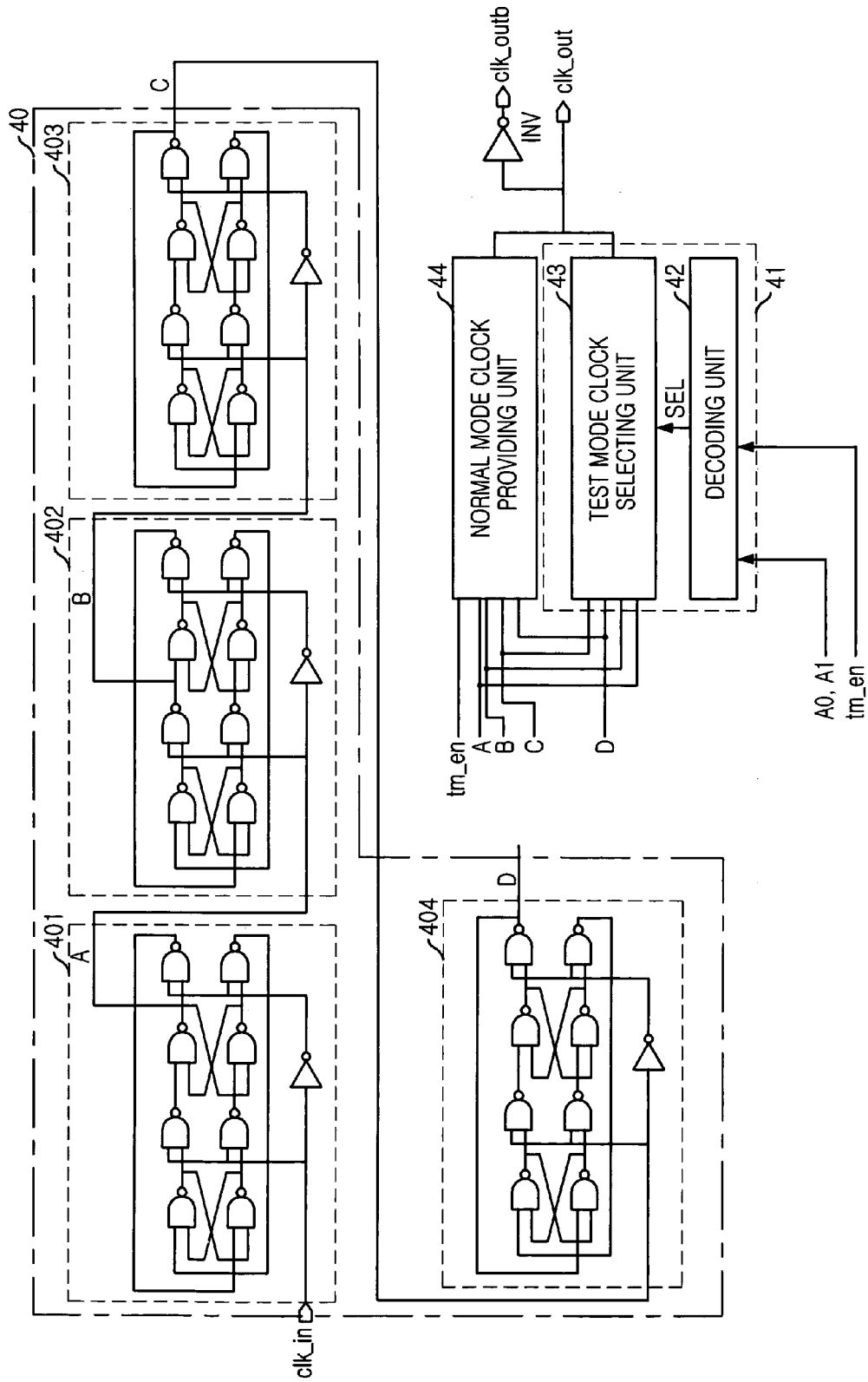
FIG. 4 offers a circuit diagram of a clock divider of a delay locked loop in accordance with an embodiment of the present invention.

FIG. 4 offers a circuit diagram of a clock divider of a DLL(delay locked loop) in accordance with an embodiment of the present invention.

Referring to FIG. 4, the clock divider of the DLL comprises a clock dividing unit 40, a test mode clock providing unit 41 and a normal mode clock providing unit 44. The clock dividing unit 40 receives a source clock clk_in of the DLL to generate 4 divided clocks A, B, C, D, each having a period different from each other. The test mode clock providing unit 41 outputs selected one of the 4 divided clocks A, B, C, D in a test mode in response to a test mode signal tm_en and address signals A0, A1. The normal mode clock providing unit 44 outputs selected one of the 4 divided clocks A, B, C, D in a normal mode in response to the test mode signal tm_en.

Also, the test mode clock providing unit 41 includes a decoding unit 42 for decoding the address signals A0, A1 in response to the test mode signal tm_en to output a period selecting signal SEL, and a test mode clock selecting unit 43 for outputting one of the 4 divided clocks A, B, C, D in response to the period selecting signal SEL.

On the other hand, the clock dividing unit 40 generates the 4 divided clocks A, B, C, D, each having a period different from each other, which further includes another dividing stage 404 for 1/16 division in addition to the dividing stages 401, 402, 403 in prior art.

The address signals A0, A1 are for control signals for selecting the dividing clock in the test mode, which are inputted through address pins.

Figure 5A:
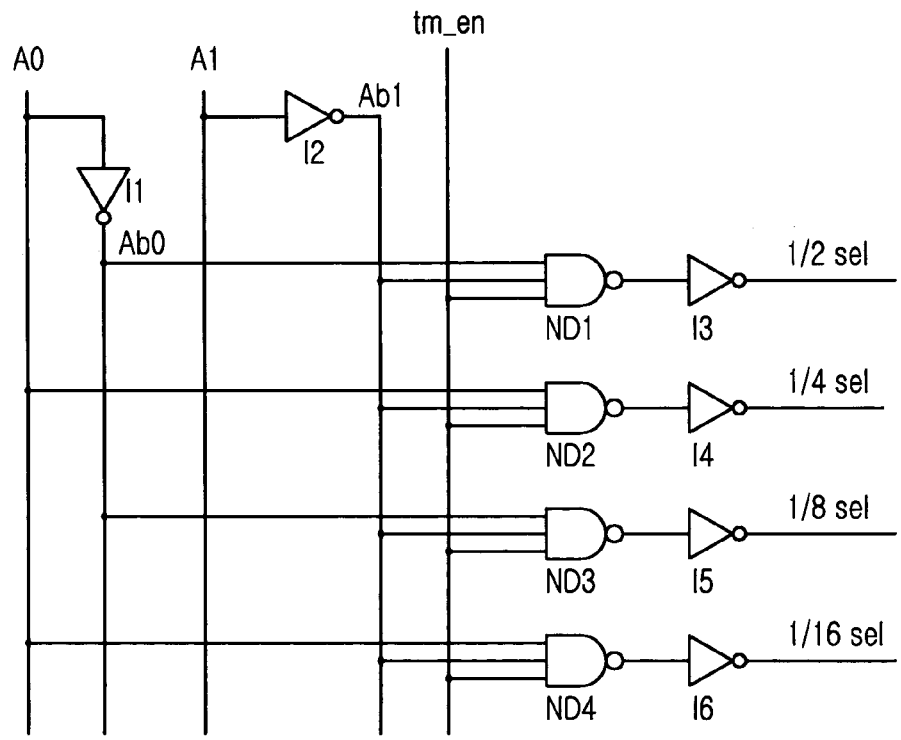
FIG. 5A represents a circuit diagram of a decoding unit.

FIG. 5A represents the circuit diagram of the decoding unit 42.

Referring to FIG. 5A the decoding unit 42 includes a plurality of 3-input NAND gates ND1, ND2, ND3, ND4, each for receiving the test mode signal tm_en as its one input and one of the combinations of the address signals A0, A1 and the inverted address signals Ab0, Ab1 as the other input, and a number of inverters I3, I4, I5, I6 for inverting the output signals of the NAND gates ND1, ND2, ND3, ND4.

Once the test mode signal tm_en is activated, the decoding unit 42 decodes the inputted address signals A0, A1 to activate one of the period selecting signals ½sel, ¼sel, ⅛sel, 1/16sel.

Figure 5B:
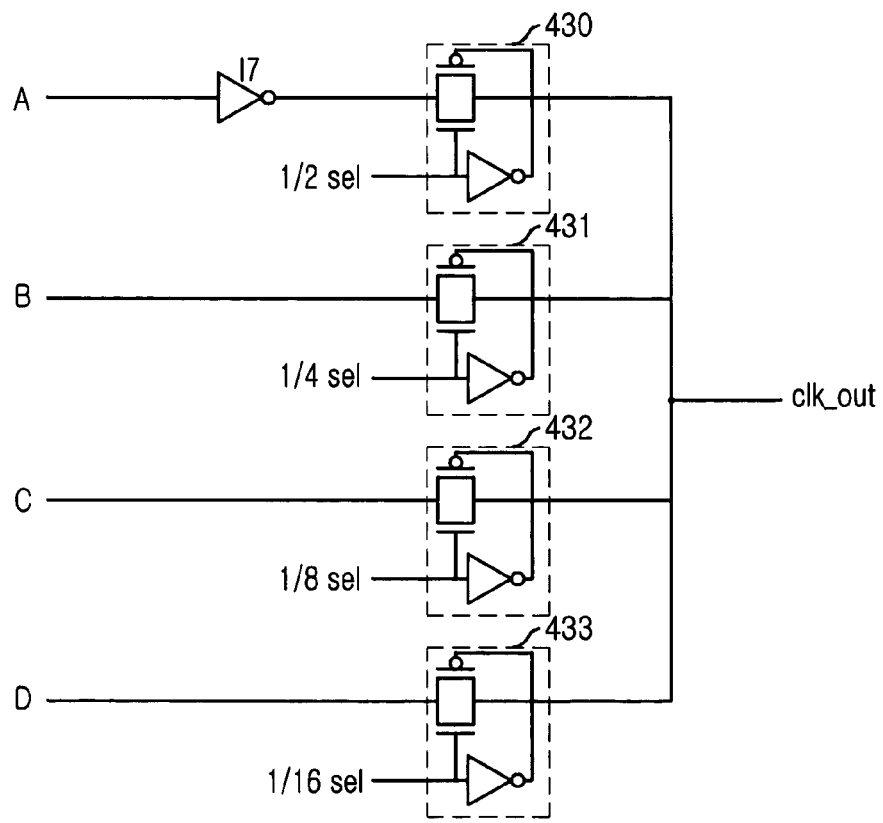
FIG. 5B illustrates a circuit diagram of a test mode clock selecting unit.

FIG. 5B illustrates the circuit diagram of the test mode clock selecting unit 43.

Referring to FIG. 5B, the test mode clock selecting unit 43 includes a plurality of transfer gates 430, 431, 432, 433 for outputting the divided clocks A, B, C, D under control of the period selecting signals ½sel, ¼sel, ⅛sel, 1/16sel, respectively.

On the other hand, the transfer gate 430 receives the inverted divided clock because the phase of the divided clock A is different from those of other divided clocks B, C, D.

Once the period selecting signals ½sel, ¼sel, ⅛sel, 1/16sel are activated, the test mode clock selecting unit 43 selectively outputs one of the divided clocks A, B, C, D, accordingly.

Figure 6:
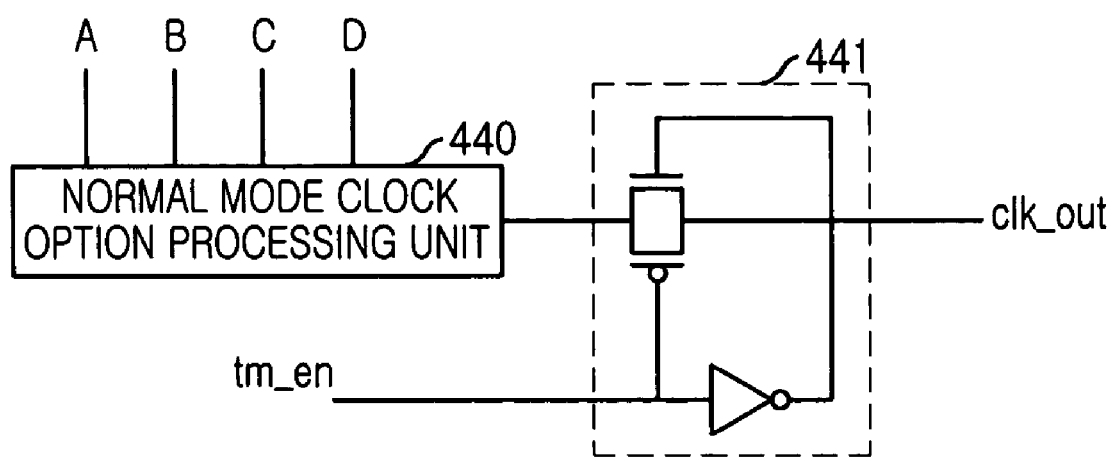
FIG. 6 represents a circuit diagram of a normal mode clock selecting unit.

FIG. 6 represents the circuit diagram of the normal mode clock selecting unit 44.

The normal mode clock providing unit 44 includes a normal mode clock option processing unit 440 for outputting the ⅛ divided clock, basically, and other divided clock that is fixed depending on an option, and a switching unit 441 for outputting the fixed divided clock from the normal mode clock option processing unit 440 in response to the test mode signal tm_en.

On the other hand, the normal mode clock option processing unit 440 includes one of a fuse option, an anti-fuse option and a metal option.

Also, the switching unit 441 includes a transfer gate that is controlled by the test mode signal tm_en.

Figure 7:
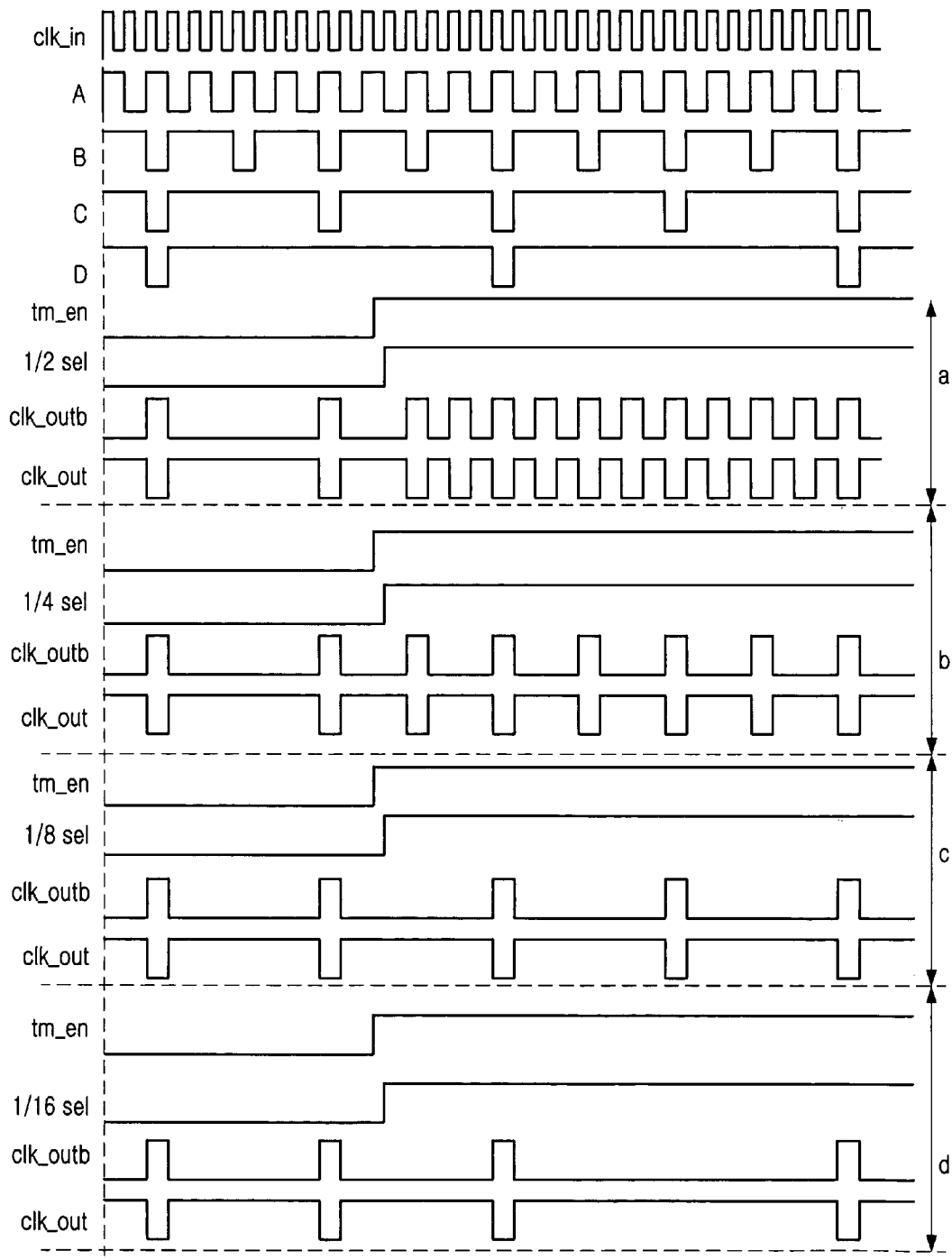
FIG. 7 provides a waveform diagram for explaining operation of the circuit shown in FIG. 4.

FIG. 7 provides a waveform diagram for explaining operation of the circuit shown in FIG. 4.

First, the dividing unit 40 receives the source clock clk_in of the DLL, having a period of tCK, as its input to generate the divided clocks A, B, C, D having various periods.

When the test mode signal tm_en is not activated, the normal mode clock providing unit 44 outputs the basically set ⅛ divided clock C.

In FIG. 7, 'a' part shows the case in which, once the test mode signal tm_en is activated and the address signals A0, A1 are inputted, the ½ period selecting signal ½sel is generated by the decoding unit 42 and then the ½ divided clock A is outputted from the test mode clock selecting unit 43. In this way, the output clock clk_out is changed from the ⅛ divided clock C to the ½ divided clock A.

Similarly, according to the inputted address signals A0, A1, the activated period selecting signal and the outputted divided clock are changed, and their detail description will be omitted for the sake of simplicity.

In FIG. 7, 'b' part shows the case in which the ¼ period selecting signal ¼sel is activated and, accordingly, the output clock clk_out is changed from ⅛ divided clock C to the ¼ divided clock B. Also, 'c' part shows the case in which the ⅛ period selecting signal ⅛sel is activated and, accordingly, the output clock clk_out is outputted as the ⅛ divided clock C. Further, 'd' part shows the case in which the 1/16 period selecting signal 1/16sel is activated and, accordingly, the output clock clk_out is changed from ⅛ divided clock C to the 1/16 divided clock D.

After such a test process, the tAC that is varied due to variation of process, temperature, a voltage and etc. is measured so that the optimum divided clock having the minimum tAC can be found. This can be applied to the normal mode clock providing unit 44 by using a fuse option, an anti-fuse option or a metal option so as to provide the optimum divided clock in the normal mode.

Consequently, the present invention as described above adds the test mode clock providing unit 41 and the normal mode clock providing unit 44 so that it can measure the tAC due to variation of process, temperature, a voltage and etc. for various periods and, in the normal mode, provide the divided clock having the minimum tAC to which the test result have been applied.

For example, though the embodiment as described above discloses a clock divider of a register controlled DLL, the present invention should not be limited to the register controlled DLL.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A clock divider of a DLL (delay locked loop), comprising:
    clock dividing means for receiving a source clock of the DLL to generate a plurality of divided clocks each having a period different from each other;
    test mode clock providing means for selectively outputting the plurality of the divided clocks in a test mode in response to a test mode signal and a test mode period selecting reference signal; and
    normal mode clock providing means for outputting selected one of the plurality of the divided clocks in a normal mode in response to the test mode signal.

2. The clock divider of the DLL as recited in claim 1, wherein the test mode clock providing means includes:
    decoding means for decoding the test mode period selecting reference signal in response to the test mode signal to generate a test mode period selecting signal; and
    test mode clock selecting means for outputting one of the plurality of the divided clocks in response to the test mode period selecting signal.

3. The clock divider of the DLL as recited in claim 1, wherein the normal mode clock providing means includes:
    normal mode clock option processing means for receiving the plurality of the divided clocks to output a divided clock that is fixed depending on an option; and
    switching means for outputting the fixed divided clock from the normal mode clock option processing means in response to the test mode signal.

4. The clock divider of the DLL as recited in claim 2, wherein the test mode period selecting reference signal is inputted through a predetermined number of address pins in the test mode.

5. The clock divider of the DLL as recited in claim 4, wherein the decoding means includes:
    a plurality of NAND gates, each for receiving the test mode signal and at least one of the test mode period selecting reference signals inputted to the address pins and inverted signals of the test mode period selecting reference signals; and
    a plurality of inverters for inverting a plurality of output signals outputted from the NAND gates, respectively.

6. The clock divider of the DLL as recited in claim 5, wherein the test mode clock selecting means includes a plurality of transfer gates for outputting the divided clock under control of outputs of the plurality of inverters, respectively.

7. The clock divider of the DLL as recited in claim 3, wherein the normal mode clock option processing means includes one of a fuse option, an anti-fuse option and a metal option.

8. The clock divider of the DLL as recited in claim 3, wherein the switching means includes a transfer gate that is controlled by the test mode signal.

* * * * *